United States Patent [19]

Sharpe-Geisler

[11] Patent Number: 5,719,516

[45] Date of Patent: Feb. 17, 1998

[54] LOCK GENERATOR CIRCUIT FOR USE WITH A DUAL EDGE REGISTER THAT PROVIDES A SEPARATE ENABLE FOR EACH USE OF AN INPUT CLOCK SIGNAL

[75] Inventor: Bradley A. Sharpe-Geisler, San Jose, Calif.

[73] Assignee: Advanced Micro Devices, Inc., Sunnyvale, Calif.

[21] Appl. No.: 575,852

[22] Filed: Dec. 20, 1995

[51] Int. Cl.[6] .......................... H03K 3/356; H03K 19/173
[52] U.S. Cl. .......................... 327/291; 327/293; 327/294; 327/298; 327/203
[58] Field of Search .......................... 327/197, 199, 327/203, 392, 393, 394, 403, 291, 298, 165, 172

[56] References Cited

U.S. PATENT DOCUMENTS

| | | | |
|---|---|---|---|
| 4,300,060 | 11/1981 | Yu | 327/197 |
| 4,709,173 | 11/1987 | Nishimichi et al. | 307/243 |
| 4,820,939 | 4/1989 | Sowell et al. | 327/203 |
| 4,825,416 | 4/1989 | Tam et al. | 365/194 |
| 4,864,161 | 9/1989 | Normal et al. | 327/197 |
| 4,970,407 | 11/1990 | Patchen | 327/203 |
| 5,027,315 | 6/1991 | Agrawal et al. | 326/40 |
| 5,117,132 | 5/1992 | Watson et al. | 326/40 |
| 5,189,315 | 2/1993 | Akata | 327/203 |
| 5,309,046 | 5/1994 | Steele | 326/39 |
| 5,357,153 | 10/1994 | Chiang et al. | 326/40 |
| 5,359,242 | 10/1994 | Veenstra | 326/39 |
| 5,369,311 | 11/1994 | Wang et al. | 327/291 |
| 5,457,409 | 10/1995 | Agrawal et al. | 326/39 |
| 5,495,195 | 2/1996 | Fontana et al. | 327/404 |

FOREIGN PATENT DOCUMENTS

| | | | |
|---|---|---|---|
| A 0 224 004 | 6/1987 | European Pat. Off. | G11C 19/00 |
| 4-348609 | 12/1992 | Japan | 327/202 |
| 5-327435 | 12/1993 | Japan | 327/202 |
| 406260902 | 9/1994 | Japan | 327/202 |
| WO 94/29958 | 12/1994 | WIPO | H03K 3/037 |

OTHER PUBLICATIONS

"Circuit Scheme to improve chip data hold time", Technical Disclosure Bulletin, Dec. 1990, vol. 33, No. 7, pp.185–189.

Primary Examiner—Timothy P. Callahan
Assistant Examiner—An T. Luu
Attorney, Agent, or Firm—Fliesler, Dubb, Meyer & Lovejoy

[57] ABSTRACT

A clock generator circuit for providing a clock signal to a dual-edged D-type flip-flop, enabling the flip-flop to be dual edged, single edged, or to enable a user to provide clock edge selection, asynchronous clocking, clock enabling, or a mixture of different type clock signals. The clock generator circuit includes inputs receiving first and second enables signals and a clock signal. The clock generator circuit further includes circuitry to provides an output clock signal which transitions when a rising edge of a pulse of the clock signal is received when the first clock signal is enabled, or if a falling edge of a pulse of the clock signal is received when the second clock signal is enabled.

7 Claims, 7 Drawing Sheets

LOCK GENERATOR CIRCUIT FOR USE WITH A DUAL EDGE REGISTER THAT PROVIDES A SEPARATE ENABLE FOR EACH USE OF AN INPUT CLOCK SIGNAL

BACKGROUND OF THE INVENTION

1. Field of the Invention

The present invention relates to a clock generator circuit for providing signals to a dual edge D-type flip-flop. More particularly, the present invention relates to a clock generator circuit for a block clock circuit for providing signals to a macrocells in a programmable logic device enabling reconfigurability of the macrocells.

2. Description of the Related Art

Figure 1:
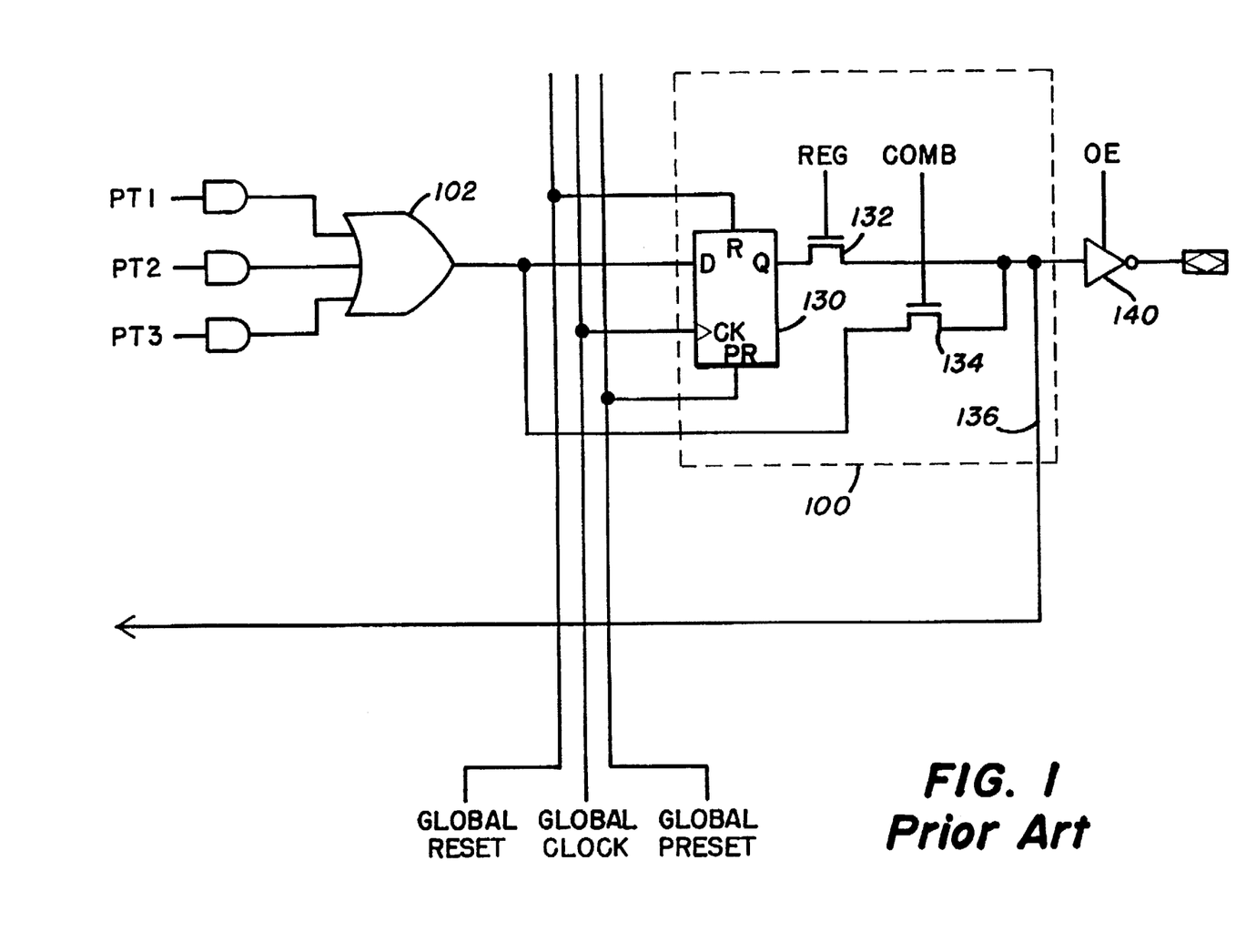
FIG. 1 shows components from a conventional PLD.

FIG. 1 shows components from a conventional programmable logic device (PLD), including a macrocell 100, typically provided in a macrocell of the PLD. In the portion of the PLD shown, a group of product term (PT) lines PT1-PT3 are provided which may each be selectively connected to a number of array cells (not shown). A sum of product terms output can be provided by connecting the PT lines through an OR gate 102. The output of the OR gate 102 is provided to the macrocell 100, which typically includes a register 130, pass gates 132 and 134, and a feedback line 136, as well as other components which are not shown in FIG. 1. To provide a registered output, the output of OR gate 102 is provided through register 130 and pass gate 132 to an output buffer 140. To provide a combinatorial output, the output of the exclusive OR gate 102 is provided through pass gate 134 to output buffer 140. Pass gates 132 and 134 have gate signals provided by a programmable cell (not shown). Feedback 136 is provided to couple the signal provided to output buffer 140 back to be selectively connected to individual product term lines PT1-PT3. Register 130 is typically a D-type flip-flop. Global signals for a reset, preset and a clock are provided to the register 130 of macrocell 100, as well as to other registers of other macrocells in the PLD.

Figure 2:
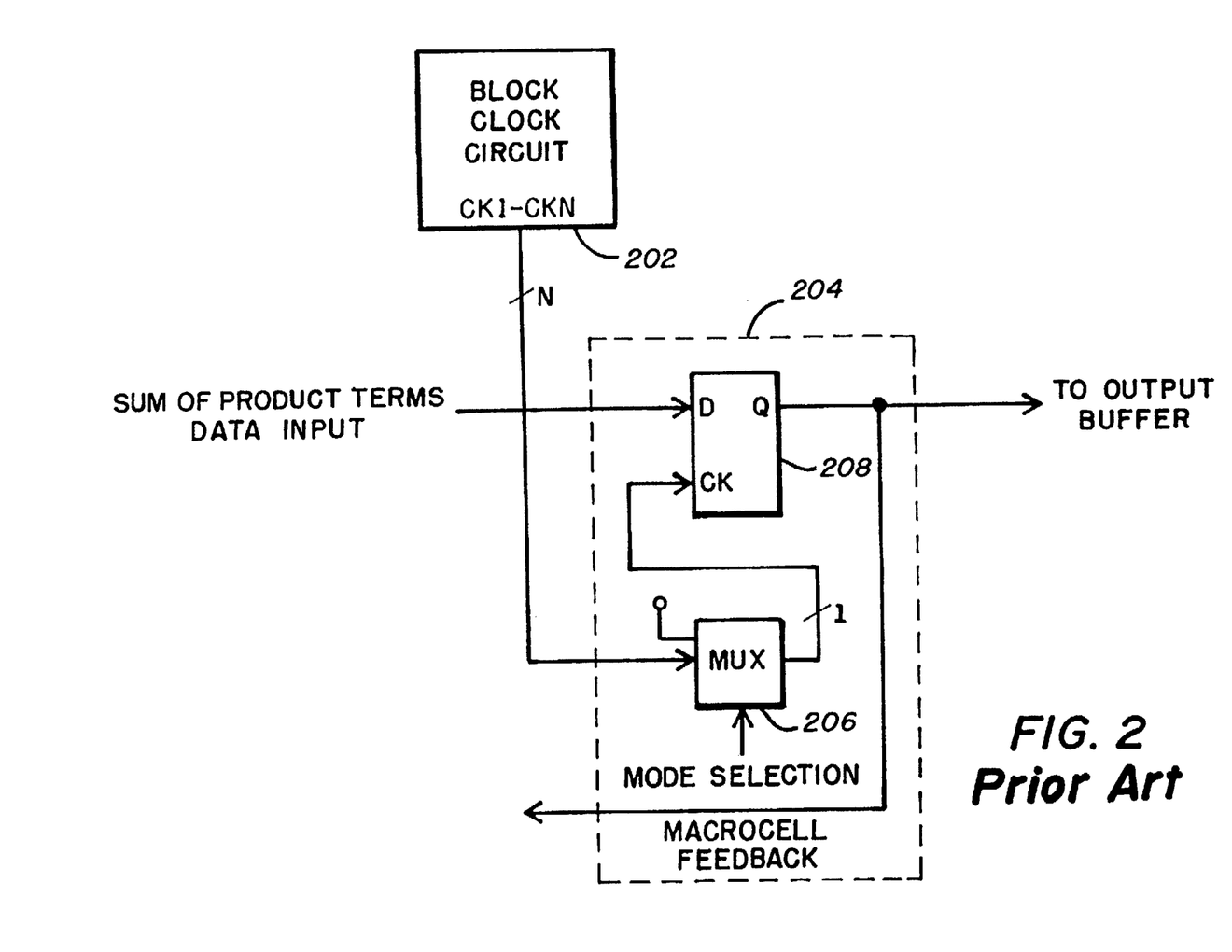
FIG. 2 shows a block diagram of components for a PLD enabling macrocells to be reconfigurable by a block clock circuit.

FIG. 2 shows a block diagram of components for a PLD enabling macrocells, such as a macrocell 204 to be reconfigurable by a block clock circuit 202. The block diagram of FIG. 2 as well as circuitry for components of the block diagram of FIG. 2 are described in U.S. Pat. No. 5,589,782 entitled "Macrocell And Clock Signal Allocation Circuit For A Programmable Logic Device (PLD) Enabling PLD Resources To Provide Multiple Functions", filed Jun. 2, 1995, and incorporated herein by reference.

The block clock circuit 202 includes clock signal allocation circuitry to provide a plurality of clock signals CK1-CKN at its outputs. The block clock circuit provides the CK1-CKN signals by allocating one or more pin clock inputs and product term input signals. The outputs of the block clock circuit 202 are provided as global signals throughout a PLD to macrocells in the PLD, such as macrocell 204.

The macrocell 204 of the present invention includes a multiplexer 206 and storage element 208. Inputs of the multiplexer 206 are connected to outputs of the block clock/control circuit 202. The multiplexer 206 further receives a mode selection signal to enable the multiplexer 206 to provide one of the clock signals received from the block clock circuit 202 to its output. The output of the multiplexer 206 is provided to the clock signal input of the storage element 208.

The storage element 208 can include circuitry such as a D-type flip flop with a data input provided to its output based on a signal received at its clock input. The data input of storage element 208 may receive a sum of product terms output, such as from the output of the OR gate 102 of FIG. 1. The Q output of the storage element 208 is provided to an output buffer of the PLD, such as buffer 140 of FIG. 1. Additionally, the Q output of the storage element 208 is provided in the PLD as a macrocell feedback, similar to line 136 of FIG. 1.

By providing appropriate clocking signals from the block clock circuit 202, the macrocell 204 can be selectively controlled to provide the functions normally provided by a conventional macrocell. For instance, by applying an appropriate clocking, the storage element 208 can be configured to operate as a latch mode, a D-type flip-flop, a dual-edge D-type flip-flop, or as a combinatorial element. Further, unlike with conventional macrocells, with the circuitry of FIG. 2, appropriate clock signals can be applied to provide dual edge clocking, clock edge selection, asynchronous clocking, clock enabling, or a mixture of different type clock signals.

For a PLD, a configurable macrocell as illustrated in FIG. 2 is desirable so that resources of the PLD may be selectively configured by a user to create the specific circuitry the user desires. Components of the PLD which provide only one particular function, such as pass gates 132 and 134 and connecting circuitry of FIG. 1, which are not used will create a wasted resource, unnecessarily occupying chip space.

SUMMARY OF THE INVENTION

The present invention provides circuitry which may be provided in a block clock circuit of a PLD, as shown in FIG. 2, to enable a dual-edge D-type flip-flop to be utilized as a reconfigurable storage element in the macrocell, as illustrated FIG. 2.

The configuration of the present invention enables clock signals to be provided to a dual edge D-type flip-flop so that the dual edge flip-flop can function as a single edge D-type flip-flop triggerable on either edge, or simply as a dual edge D-type flip-flop. The configuration of the present invention further enables a user to configure clock signals to provide clock edge selection, asynchronous clocking, clock enabling, or a mixture of different type clock signals.

The present invention is a clock generator circuit including inputs receiving first and second enabling signals and a clock signal. The clock generator circuit further includes circuitry to provide an output clock signal which transitions when a rising edge of a pulse of the clock signal is received when the first clock signal is enabled, or if a falling edge of a pulse of the clock signal is received when the second clock signal is enabled.

The clock generator circuit may be provided as an element of a block clock circuit, such as 202 of FIG. 2, to provide a signal to a dual edged D-type flip-flop included as a storage element of a macrocell, as in FIG. 2. Further details of circuitry for the clock generator circuit are provided in text which follows.

BRIEF DESCRIPTION OF THE DRAWINGS

Further details of the present invention are explained with the help of the attached drawings in which.

DETAILED DESCRIPTION

Figure 3:
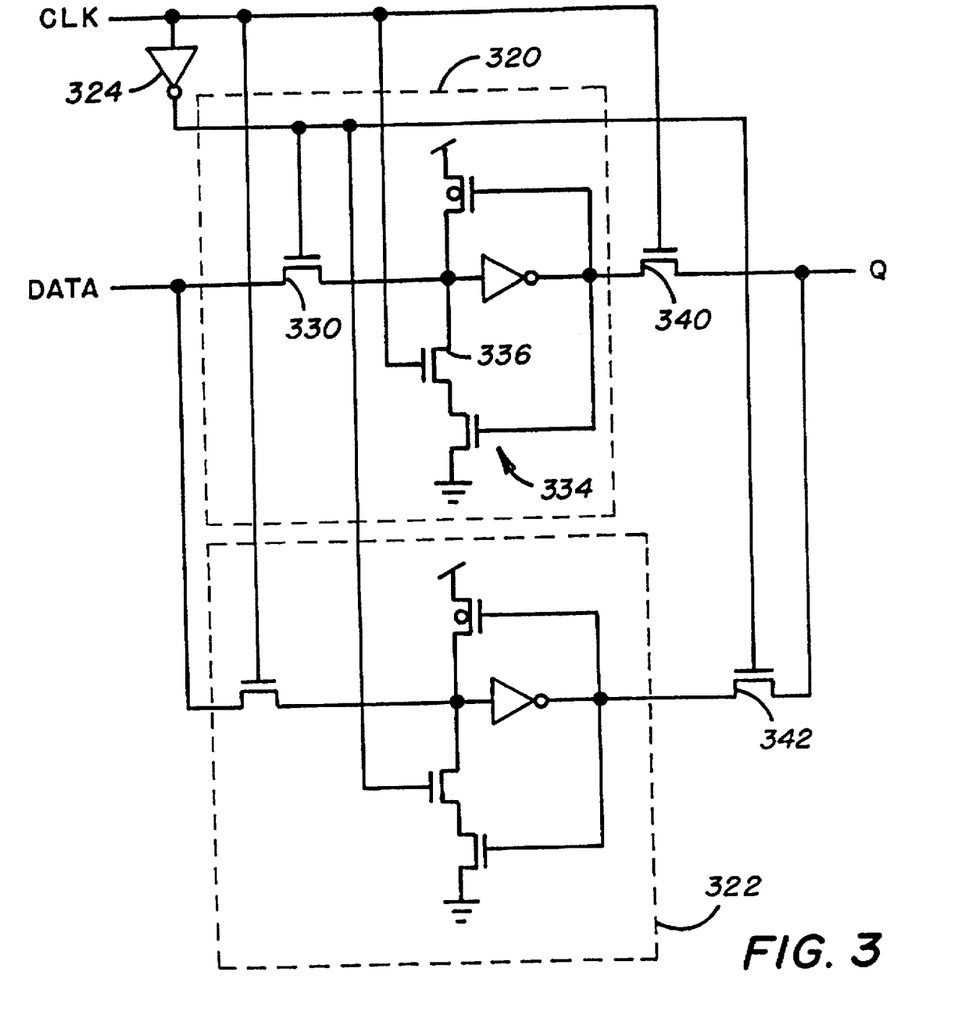
FIG. 3 shows specific circuitry for the dual edged D flip-flop.

FIG. 3 shows specific circuitry for the dual-edged D-type flip-flop which may be used as a storage element 208 of a macrocell 204 as shown in FIG. 2. As shown, the circuit of FIG. 3 includes two configurable latches 320 and 322, each being enabled by opposite edges of a clock signal (CLK) of the dual edge D flip-flop provided directly and through inverter 324. Configurable latches 320 and 322 include identical circuit components, so only 320 will be described. Configurable latch 320 includes pass gate 330 with a gate coupled to receive the CLK signal and a source to drain path connecting the data input (DATA) of the dual edge D flip-flop to the input of a latch 334. One of the inverter of the latch 334 has a pass gate 336 connecting its pull down transistor to its pull up transistor, the pull up transistor being very weak. The pass gate 336 has its gate coupled to receive the CLK signal. The output of latch 334 is connected through a pass gate 340 to the Q output of the dual edged D flip-flop, while the output of a similar latch in configurable latch 322 is connected to the Q output of the dual edged D flip-flop through a pass gate 342. Pass gates 340 and 342 have gates receiving opposite edges of the CLK signal.

Figure 4:
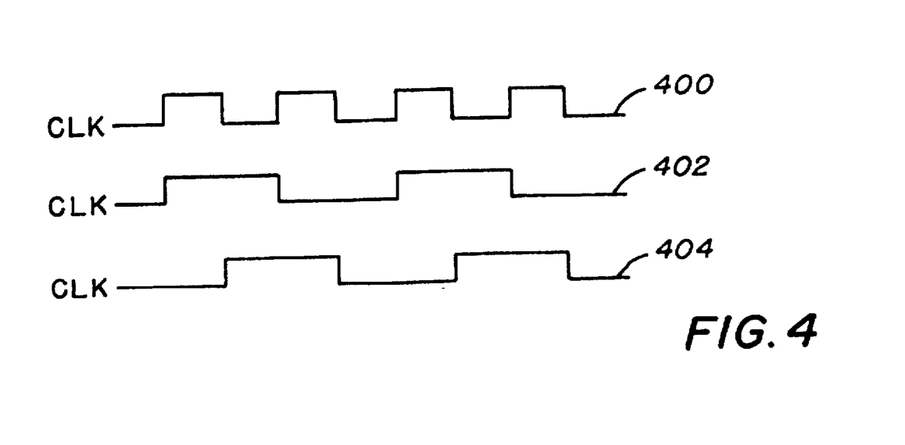
FIG. 4 shows clock signals provided to the dual-edged D-type flip-flop of FIG. 3 and its resulting outputs.

In operation, a clock signal such as signal 400 of FIG. 4 is typically provided to the CLK input of the flip-flop of FIG. 3. To make the dual-edged D-type flip-flop of FIG. 3 function as a single edged D-type flip-flop, a clock signal 402 may be provided which doubles CLK signal pulse length of signal 400. To provide a single edge D-type flip-flop transitioning on an opposite edge than when signal 402 is received, the clock signal 400 pulse length may be doubled with pulses beginning on a high to low edge to form clock signal 404. To provide clock edge selection, or other functions, a clock signal may be formed from clock signal 400 which is enabled or disabled at specific times to control when the Q output of the flip-flop of FIG. 3 provides a pulse.

Figure 5:
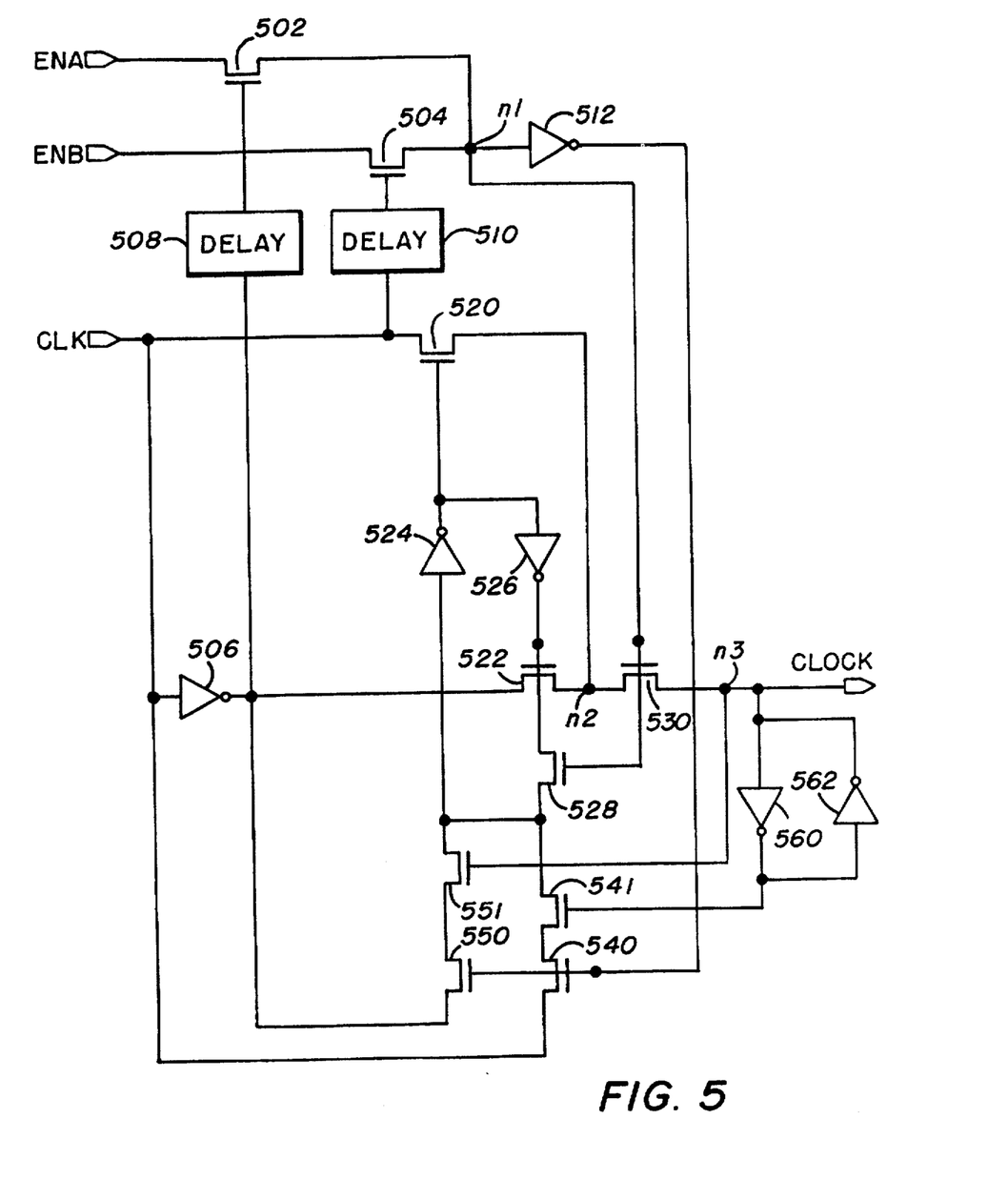
FIG. 5 shows an embodiment of the clock generator circuit of the present invention.

FIG. 5 shows an embodiment of a clock generator circuit of the present invention which may be configured to provide clock signals to a dual-edged D-type flip-flop to enable the D-type flip-flop to be configurable as described above.

FIG. 5 includes inputs receiving a first enable signal ENA, a second enable signal ENB, and a clock signal CLK, and an output providing a signal CLOCK. In FIG. 5, the ENA signal is provided through pass transistor 502 to a node n1, while the ENB signal is provided through pass transistor 504 to node n1. The gate of transistor 504 receives the clock signal CLK through a delay element 510. The gate of transistor 502 receives the CLK signal through inverter 506 and delay element 508. The inverse of the signal at node n1 is provided through inverter 512, having an input connected to node n1.

In operation, transistors 502,504, inverter 506 and delay elements 508 and 510 form a "combined enable signal generator" for providing a combined enable signal at node n1. The combined enable signal generator functions to provide a high signal at node n1 to indicate a transition when a rising edge of a pulse of the CLK signal is received and the ENA signal is high, and a high signal at node n1 to indicate a transition when a falling edge of a pulse of the CLK signal is received and the ENB signal is high.

The remaining circuitry of FIG. 5 functions as a clock signal providing means to provide CLOCK signal based on the signal received at node n1 and the CLK signal and its inverse provided at the output of inverter 506. The clock signal providing means includes a latch which includes inverter 524 and inverter 526. The output of inverter 524 is connected to the input of inverter 526 and to the gate of a pass gate 520. The pass gate 520 has a source to drain path providing the CLK signal to a node n2. The output of inverter 526 is connected to the gate of a pass gate 522, the pass gate 522 having a source to drain path connecting the output of inverter 506 to node n2 to provides the inverse of the CLK signal to node n2. An additional pass gate 528 has a source to drain path connecting the output of inverter 526 to the input of inverter 524. The gate of pass gate 528 is connected to node n1.

To set and reset the latch 524, 526, the clock signal providing means further includes series pass gates 540 and 541 which have source to drain paths connected together and connecting the CLK signal to the input of inverter 524. Further to set and reset latch 524, 526, the circuit of FIG. 5 includes series pass gates 550 and 551 with source to drain paths connected together and connecting the inverse of the CLK signal at the output of inverter 506 to the input of inverter 524. The gates of transistors 540 and 550 are connected to the output of inverter 512.

The CLOCK output of the clock generator circuit of FIG. 5 is provided from node n3. Node n3 is connected to node n2 through the source to drain path of pass gate 530. The gate of pass gate 530 is connected to node n1. The output signal of the circuit of FIG. 5 at node n3 provides the gate input of transistor 551. The inverse of the CLOCK output is provided by connecting node n3 through inverter 560. The output of inverter 560 forms the input of pass gate 541. To prevent the input of inverter 560 from drifting if pass gate 530 is turned off, inverter 562 is provided with an input connected to the output of inverter 560 and an output connected to the input of inverter 560.

In operation, delay elements 508 and 510 are provided to assure the signal at node n1 does not transition until the CLK signal can be provided to node n2 through either pass gate 520 or 522.

Further details of the operation of the circuit of FIG. 5 are described with reference to the signals of FIG. 6. With the ENA signal 602 and the ENB signal 604 both initially low, the signal n1 606 remains low irrespective of the CLK signal as controlled by the combined enable signal generator portion of FIG. 5. With ENA high, n1 goes high when the CLK signal 600 is low. With ENB high, n1 goes low when the CLK signal 600 is high, and with both ENA and ENB high, n1 remains high.

First, assuming the CLOCK signal is high and n1 is low, transistors 540 and 541 will pass the CLK signal to inverter 524 so that CLK will be provided to node n2 by transistor 520, transistor 522 being off. Transistor 530 will be off preventing node n2 from changing the state of the CLOCK signal.

With ENA going high, n1 will go high when CLK goes low. With n1 high, transistor 530 will turn on, but with CLK initially low, no change will occur in CLOCK. With n1 being high, transistor 528 will be on and transistors 540 and 550 will turn off, latching the state of 524 and 526 to keep transistor 520 on and 522 off.

When the CLK then goes high, CLOCK will transition to high to turn off 541 and turn on 551, but with 550 and 540 off, the state of latch 524, 526 will remain latched. When the CLK goes high, with ENA high and ENB low, n1 will transition to low to turn off transistors 530 and 528 and turn off 540 and 550 to enable CLOCK to reset latch 524, 526 to turn on transistor 522 and turn off transistor 520.

When CLK returns to low with only ENA high, the inverse of CLK will be provided to node n2. Node n1 will then return to high to turn on transistor 530 to pass the signal at node n2 to CLOCK, so with CLK low, CLOCK will remain high. Transistor 522 will be on and transistors 540 and 550 will be off to maintain the state of latch 524, 526.

Next it is assumed that ENB goes high along with ENA. With both ENA and ENB high, n1 will remain high. With n1 high, transistors 530 and 528 will remain on to pass the signal from node n2 to n3 and latch the state of latch 524 and 526. Thus, with every transition of CLK, the output of inverter 506 will transition to similarly transition CLOCK.

Next it is assumed that ENA goes back low so that only ENB remains high. With CLK high, node n1 will be high to turn on transistors 530 and 528 to pass the signal from n2 to n3 and latch the previous state of latch 524 and 526 so that CLOCK maintains its previous state. With CLK transitioning to low, the transition in node n2 will be passed to node n3 to transition CLOCK, and then transistor 530 and 528 will be turned off by n1 going low, and transistors 550 and 540 will turn on to enable CLOCK to reset latch 524, 526 so that on a subsequent low to high transition CLOCK will maintain its previous state.

The clock generator circuit of FIG. 5, thus, functions to provide the CLOCK signal which transitions when a rising edge of a pulse of the CLK signal is received when the ENA signal is enabled, or when a falling edge of a pulse of the CLK signal is received when the ENB signal is enabled. Thus, referring to FIG. 4, with a CLK signal 400 received, CLK signal 402 will be provided as the CLOCK output with ENA only enabled, CLK signal 404 will be provided as the CLOCK output with ENB only enabled, and CLK signal 400 will be provided as the CLOCK output with both ENA and ENB enabled. By selectively enabling ENA and ENB at different times, combinations of signals 400, 402 and 404 can be provided. By applying the CLOCK output of FIG. 5 to the input of a dual-edged D-type flip-flop, the dual edge flip-flop can be configured to function as a single edge D-type flip-flop triggerable on either edge, or simply as a dual edge D-type flip-flop. Further, a user can selectively provide clock edge selection, asynchronous clocking, clock enabling, or a mixture of different type clock signals.

Figure 7:
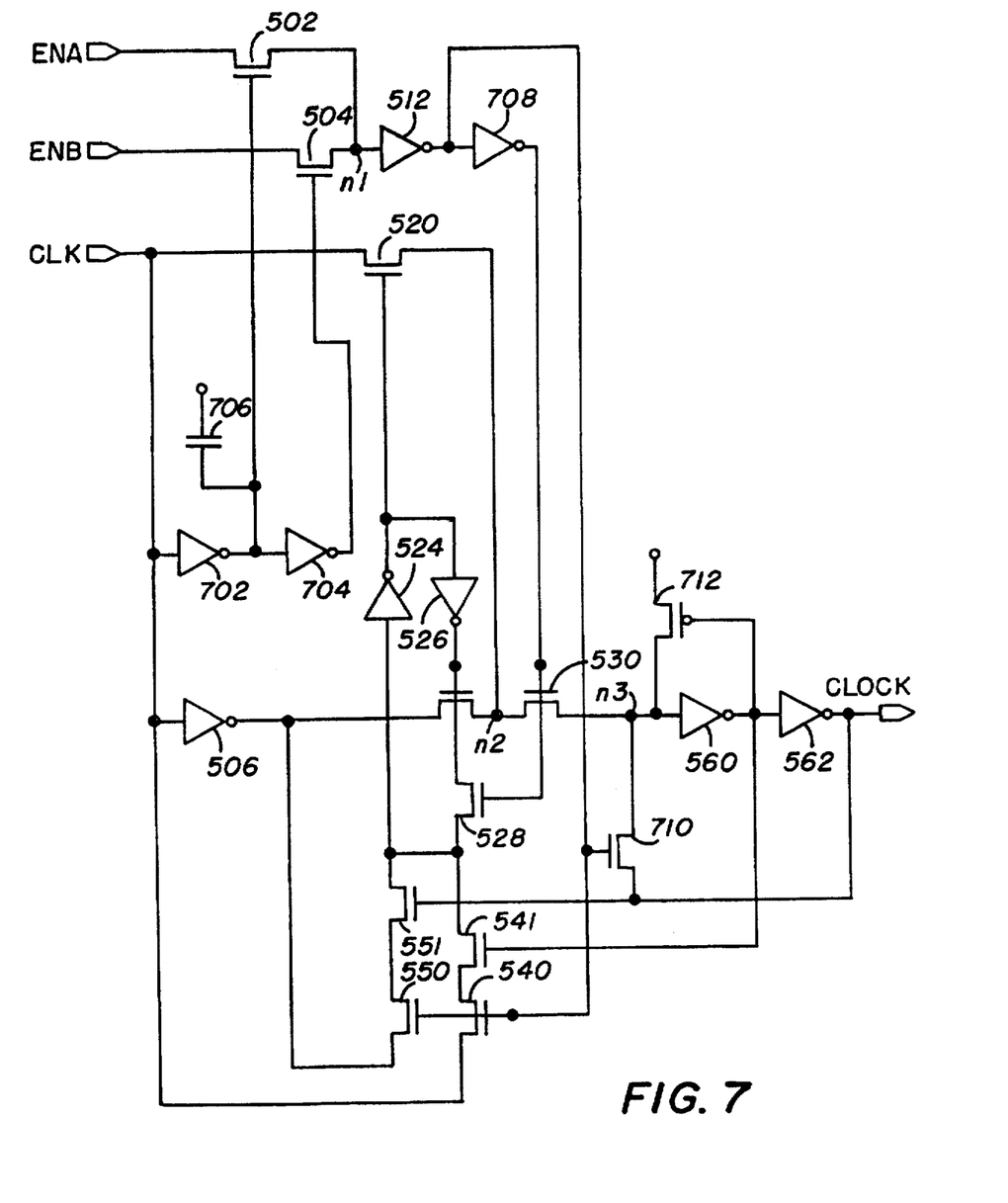
FIG. 7 shows circuitry providing the delay elements of FIG. 5 and modifications to enable the circuit of FIG. 5 to drive a large capacitive load.

FIG. 7 shows circuitry providing the delay elements 508 and 510 of FIG. 5 and modifications to enable the clock generator circuit of FIG. 5 to drive a large capacitive load. To provide delay elements 508 and 510, the circuit of FIG. 7 includes a capacitor 706 provided between inverters 702 and 704. Inverter 702 replaces the inverter 506 of FIG. 5 to provide an inverse of the clock signal CLK to the gate of transistor 502, while inverter 704 is provided from the output of inverter 702 to the gate of transistor 504 to replace the direct CLK connection to the gate of transistor 504 of FIG. 5. Further, in FIG. 7 inverter 708 is added with an input connected to the output of inverter 512 and an output connected to the gates of transistors 530 and 528, as opposed to a direct connection to node n1 to slow the transition of transistors 528 and 530. In FIG. 7, components carried forward from FIG. 5 are similarly labeled, as will be components in subsequent drawings.

In FIG. 7, the output of inverter 562 provides the CLOCK signal to drive a high capacitance load. By providing the CLOCK output from inverter 562 and increasing the size of transistors forming inverters 560 and 562 from FIG. 5, the CLOCK signal my be provided to drive larger loads.

Instead of connecting inverter 562 directly to node n2, to increase switching speed the source to drain path of a transistor 710 is utilized to connect inverter 562 to node n2. PMOS transistor 712 has a gate connected to the output of inverter 560 and a source to drain path connecting Vdd to the input of inverter 560 to prevent drift at the input of inverter 560 should pass gates 710 and 530 be turned off. The gate of transistor 710 is connected to the output of inverter 612 to enable inverters 560, 562 to function as a latch only when latch 524, 526 is disabled.

Figure 6:
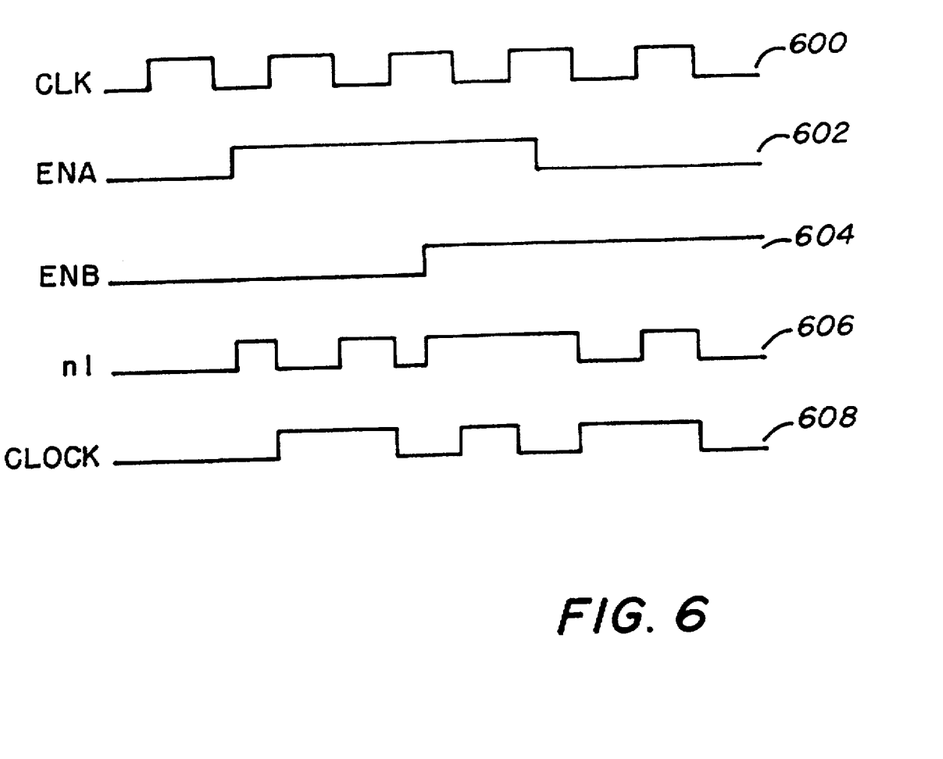
FIG. 6 shows signals illustrating the function of FIG. 5.
Figure 8:
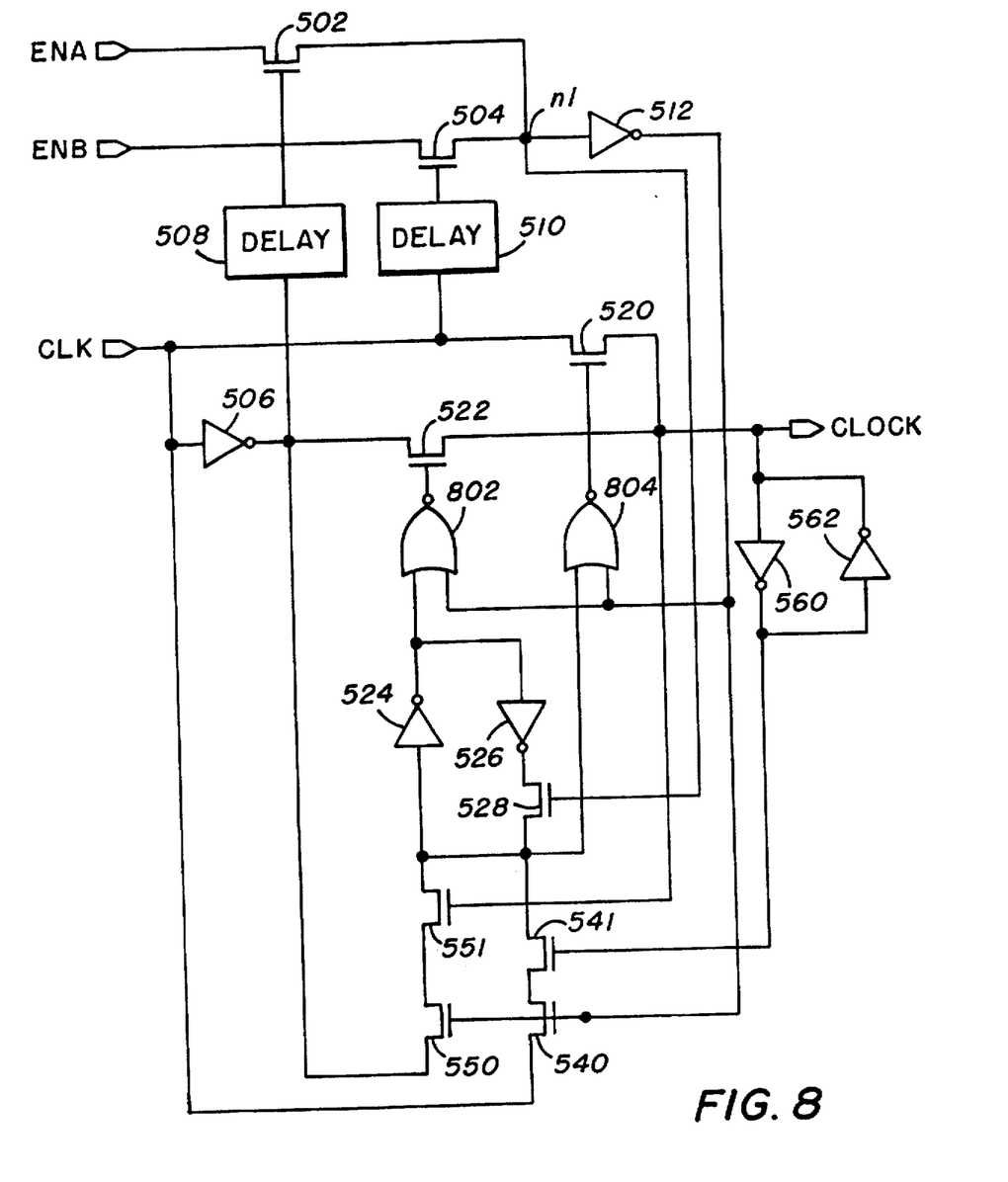
FIG. 8 shows an alternative embodiment for the clock generator circuit of FIG. 6.

FIG. 8 shows an alternative embodiment for the clock generator circuit of FIG. 6. FIG. 8 removes transistor 530 in the path between the CLK and CLOCK signals. In FIG. 8, NOR gates 802 and 804 are alternatively provided. The NOR gate 802 provides a connection from the output of inverter 524 to the gate of pass transistor 522, while NOR gate 804 provides a connection from the output of inverter 522 to the gate of pass gate 522. Second inputs of NOR gates 802 and 804 are provided from the output of inverter 512. Transistor 522 makes a direct connection from the output of inverter 506 to the CLOCK output, as opposed to through transistor 520 in FIG. 5.

In operation, the Circuit of FIG. 8 functions similar to FIG. 5 to provide the CLOCK signal output which transitions when a rising edge of a pulse of the CLK signal is received when the ENA signal is enabled, or when a falling edge of a pulse of the CLK signal is received when the ENB signal is enabled.

Although the invention has been described above with particularity, this was merely to teach one of ordinary skill in the art how to make and use the invention. Many modifications will fall within the scope of the invention, as that scope is defined by the claims which follow.

What is claimed is:

1. A clock signal generating circuit receiving a first enable signal, a second enable signal and a clock signal including clock pulses each having a rising edge and a falling edge, the clock signal generating circuit comprising:

a combined first and second enable signal generating means connected to receive the first enable signal, the second enable signal, and the clock signal, and to provide the combined first and second enable signal having a first state from a period after a falling edge of a given one of the clock pulses is received until after a riding edge of the given clock pulse is received when the first enable signal is in a state indicating enablement, and from a period after the rising edge, of a particular one of the clock pulses is received until after a falling edge of the particular clock pulse is received when the second enable signal is in a state indicating enablement, and after an edge of one of the clock pulses is received when both the first and second enable signal are in a state indicating enablement; and a clock signal providing means connected for receiving the clock signal and the combined the first and second enable signal from the combined first and second enable signal generating means, the clock signal providing means providing a transition in an output of the clock signal generating circuit when the clock signal transitions and the combined first and second enable signal is in the first state.

2. The clock signal generating circuit of claim 1 wherein the combined first and second enable signal generating means comprises:

a first enable signal pass gate having a source to drain path connecting the first enable signal to a combined enable signal node for providing the combined first and second enable signal, and a gate coupled to receive an inverse of the clock signal;

a second enable signal pass gate having a source to drain path connecting the second enable signal to the combined enable signal node, and a gate coupled to receive the clock signal.

3. The clock signal generating circuit of claim 2 wherein the clock signal providing means comprises:

a latch including a first inverter and a second inverter having an input connected to the output of the first inverter;

a non-inverted clock signal pass gate having a source to drain path coupling the clock signal to a clock signal providing node, and a gate connected to the output of the first inverter of the latch;

an inverted clock signal pass gate having a source to drain path coupling the inverse of the clock signal to the clock signal providing node, and a gate connected to the output of the second inverter of the latch;

a latch enabling pass gate having a source to drain path connecting the output of the second inverter to the input of the first inverter of the latch, and a gate coupled to the combined enable signal node for receiving the combined first and second enable signal;

a clock signal providing pass gate having a source to drain path connecting the clock signal providing node to a clock signal output node which provides the output of the clock signal generating circuit, and a gate coupled to the combined enable signal node for receiving the combined first and second enable signal;

an inverted clock signal pass gate pair including a first and second pass gate with source to drain paths connected together to couple the inverse of the clock signal to the input of the first inverter of the latch, the gate of the first pass gate coupled to the combined enable signal node for receiving the inverse of the combined first and second enable signal, and the gate of the second pass gate coupled to the clock signal output node to receive the output of the clock signal generating circuit; and an clock signal pass gate pair including a first and second pass gate with source to drain paths connected together to couple the clock signal to the input of the first inverter of the latch, the gate of the first pass gate of the clock signal pass gate pair coupled to the combined enable signal node for receiving the inverse of the combined first and second enable signal, and the gate of the second pass gate of the clock signal pass gate pair coupled to the clock signal output node to receive the inverse of the output of the clock signal generating circuit.

4. The clock signal generating circuit of claim 3 wherein the clock signal is provided to the clock signal providing means prior to the combined first and second enable signal generating means to enable the clock signal to be coupled to the clock signal providing node prior to the combined enable signal node providing the combined first and second enable signal.

5. The clock signal generating circuit of claim 1, wherein the output of the clock signal generating means is coupled to the clock input of a dual-edge D-type flip-flop.

6. A clock signal generating circuit receiving a first enable signal, a second enable signal and a clock signal including clock pulses each having a rising edge and a falling edge, the clock signal generating circuit comprising:

a first enable signal pass gate having a source to drain path connecting the first enable signal to a combined enable signal node for providing the combined first and second enable signal, and a gate;

a second enable signal pass gate having a source to drain path connecting the second enable signal to the combined enable signal node, and a gate;

a latch including a first inverter and a second inverter having an input connected to the output of the first inverter;

a non-inverted clock signal pass gate having a source to drain path coupling the inverse of the clock signal to a clock signal providing node, and a gate connected to the output of the first inverter of the latch;

an inverted clock signal pass gate having a source to drain path coupling the inverse of the clock signal to the clock signal providing node, and a gate connected to the output of the second inverter of the latch;

a latch enabling pass gate having a source to drain path connecting the output of the second inverter to the input of the first inverter of the latch, and a gate coupled to the combined enable signal node for receiving the combined first and second enable signal;

a clock signal providing pass gate having a source to drain path connecting the clock signal providing node to a clock signal output node which provides the output of the clock signal generating circuit, and a gate coupled to the combined enable signal node for receiving the combined first and second enable signal;

an inverted clock signal pass gate pair including a first and second pass gate with source to drain paths connected together to couple the inverse of the clock signal to the input of the first inverter of the latch, the gate of the first pass gate coupled to the combined enable signal node for receiving the inverse of the combined first and second enable signal, and the gate of the second pass gate coupled to the clock signal output node to receive the output of the clock signal generating circuit; and an clock signal pass gate pair including a first and second pass gate with source to drain paths connected together to couple the clock signal to the input of the first inverter of the latch, the gate of the first pass gate of the clock signal pass gate pair coupled to the combined enable signal node for receiving the inverse of the combined first and second enable signal, and the gate of the second pass gate of the clock signal pass gate pair coupled to the clock signal output node to receive the inverse of the output of the clock signal generating circuit.

7. The clock signal generating circuit of claim 6 further comprising:

a first inverter having an input connected to receive the clock signal and an output connected to the gate of the first enable signal pass gate;

a second inverter having an input connected to the output of the first inverter and an output connected to the gate of the second enable signal pass gate; and a capacitor coupled to the output of the first inverter.

* * * * *

UNITED STATES PATENT AND TRADEMARK OFFICE
CERTIFICATE OF CORRECTION

PATENT NO. : 5,719,516
DATED : February 17, 1998
INVENTOR(S) : Sharpe-Geisler

It is certified that error appears in the above-indentified patent and that said Letters Patent is hereby corrected as shown below:

Column 6, line 51, delete "riding" and insert --rising--.

Signed and Sealed this

Twenty-first Day of April, 1998

Attest:

BRUCE LEHMAN

Attesting Officer

Commissioner of Patents and Trademarks